United States Patent
Monney

(10) Patent No.: US 9,542,050 B2
(45) Date of Patent: Jan. 10, 2017

(54) MULTI-SHIELD CAPACITIVE SENSING CIRCUIT

(71) Applicant: Semtech Corporation, Camarillo, CA (US)

(72) Inventor: Pascal Monney, San Diego, CA (US)

(73) Assignee: Semtech Corporation, Camarillo, CA (US)

( * ) Notice: Subject to any disclaimer, the term of this patent is extended or adjusted under 35 U.S.C. 154(b) by 77 days.

(21) Appl. No.: 14/561,049

(22) Filed: Dec. 4, 2014

(65) Prior Publication Data

US 2016/0162068 A1 Jun. 9, 2016

(51) Int. Cl.
*G06F 3/044* (2006.01)
*G06F 3/01* (2006.01)
*G06F 3/02* (2006.01)
*H03K 17/96* (2006.01)

(52) U.S. Cl.
CPC ............ *G06F 3/044* (2013.01); *G06F 3/017* (2013.01); *G06F 3/0202* (2013.01); *H03K 17/9622* (2013.01); *G06F 2203/04103* (2013.01); *G06F 2203/04107* (2013.01); *H03K 2217/960765* (2013.01)

(58) Field of Classification Search
CPC .... G06F 3/0414; G06F 3/0416; G06F 3/0418; G06F 3/044
USPC .......................................................... 345/174
See application file for complete search history.

(56) References Cited

U.S. PATENT DOCUMENTS 9,213,454 B2 * 12/2015 Chang ...................... G06F 3/044
9,304,633 B2 * 4/2016 Chang ...................... G06F 3/044
2005/0270041 A1 * 12/2005 Lieder ...................... G01B 7/14 324/663
2008/0158187 A1 * 7/2008 Ho ....................... G06F 3/0416 345/173
2011/0032207 A1 * 2/2011 Huang .................... G06F 3/044 345/174

(Continued)

FOREIGN PATENT DOCUMENTS

WO    2014113936 A1    7/2014

OTHER PUBLICATIONS

Analog Devices, Inc., "24-Bit Capacitance-to-Digital Converter with Temperature Sensor", pp. 1-28, 2007.

(Continued)

*Primary Examiner* — Fred Tzeng
(74) *Attorney, Agent, or Firm* — Brian M. Kaufman; Robert D. Atkins; Patent Law Group: Atkins and Associates, P.C.

(57) ABSTRACT

A proximity sensor includes a capacitive touch controller. A first shielding area is coupled to a first shield terminal of the capacitive touch controller. A second shield area is coupled to a second shield terminal of the capacitive touch controller. A first sensing element is disposed adjacent to the first shielding area. The first sensing element is coupled to a first sensing terminal of the capacitive touch controller. A second sensing element is disposed adjacent to the second shielding area. The second sensing element is coupled to a second sensing terminal of the capacitive touch controller. The capacitive touch controller is configured to associate the first sensing element with the first shielding area. A self-capacitance of the first sensing element is measured while the second shielding area is inactive. The self-capacitance of the first sensing element is measured at a first frequency.

23 Claims, 7 Drawing Sheets

(56) References Cited

U.S. PATENT DOCUMENTS

| | | | |
|---|---|---|---|
| 2012/0074961 A1 | 3/2012 | Herrmann | |
| 2012/0169656 A1* | 7/2012 | Chang | G06F 3/0418 345/174 |
| 2013/0038573 A1* | 2/2013 | Chang | G06F 3/044 345/174 |
| 2013/0090873 A1* | 4/2013 | Lundstrum | H03K 17/962 702/64 |
| 2014/0104222 A1* | 4/2014 | Chang | G06F 3/0416 345/174 |
| 2014/0247239 A1* | 9/2014 | Jamshidi-Roudbari | G06F 3/0414 345/174 |
| 2015/0055031 A1* | 2/2015 | Yang | G06F 3/044 349/12 |
| 2015/0160756 A1* | 6/2015 | Polishchuk | G06F 3/044 345/174 |
| 2015/0248177 A1* | 9/2015 | Maharyta | G06F 3/044 345/174 |
| 2015/0374295 A1* | 12/2015 | Boedecker | A61B 5/0215 600/377 |

OTHER PUBLICATIONS

Cypress Semiconductor, "PSoC 4 Capsense Design Guide", pp. 1-101, Apr. 19, 2013.
Semtech Corporation, "Wireless & Sensing", pp. 1-39, Feb. 5, 2014.

\* cited by examiner

MULTI-SHIELD CAPACITIVE SENSING CIRCUIT

FIELD OF THE INVENTION

The present invention relates in general to sensors and, more particularly, to a multi-shield capacitive sensing circuit.

BACKGROUND OF THE INVENTION

Smartphones and other mobile devices have rapidly become ubiquitous throughout the world. Mobile phones and tablet computers are commonly seen in use at restaurants, in waiting rooms, or on street corners. Mobile devices are used for gaming, photography, listening to music, social networking, or simply talking with another person via a built-in microphone and speaker.

Mobile devices enrich lives by keeping family and friends in communication, allowing any moment to be captured as a photo or video, and providing a means of contacting someone in an emergency situation. FIG. 1a illustrates a mobile device 10. Mobile device 10 is a touchscreen slate cellular (cell) phone. In other embodiments, mobile device 10 is a tablet computer, pager, GPS receiver, smartwatch or other wearable computer, laptop computer, handheld game console, or any other device utilizing capacitive proximity or touch sensing.

Mobile device 10 includes proximity sensor 11. Proximity sensor 11 detects the distance of a user from a front face of mobile device 10. Proximity sensor 11 uses the self-capacitance of a sensing element to determine whether a user is in proximity. Proximity sensor 11 also determines the distance of the user from the front face of mobile device 10. Self-capacitance of the sensing element changes as a user's body part moves nearby proximity sensor 11. The operating system of mobile device 10 is programmed to react when proximity sensor 11 reports a user is in proximity to the mobile device. In one embodiment, radio frequency (RF) output power of mobile device 10 is reduced when a user is in proximity of the mobile device to prevent exceeding specific absorption rate (SAR) regulations. SAR is a measure of the rate at which energy is absorbed by the human body when exposed to an RF electromagnetic field.

Mobile device 10 includes touchscreen 12 on a front side of the mobile device. Touchscreen 12 is used to display a graphical user interface (GUI). The GUI on touchscreen 12 presents feedback, notifications, and other information to a user as determined by an operating system of mobile device 10. Touchscreen 12 is sensitive to physical touch from body parts of a user of mobile device 10. Touchscreen 12 utilizes resistance, capacitance, acoustic waves, an infrared grid, optical imaging, or other methods to determine the presence and location of a user's touch.

In one common usage scenario of mobile device 10, touchscreen 12 displays a button as a part of the GUI, and a user touches the location of the button on the touchscreen to perform an action associated with the button. In one embodiment, touchscreen 12 displays a 3×4 telephone keypad. A user dials a telephone number on the displayed keypad by touching touchscreen 12 at the locations where the desired numbers to dial are displayed. Touchscreen 12 displays an alphanumeric keyboard along with, or as an alternative to, the telephone keypad, with a user touching the touchscreen in the location of letters, numbers, or symbols to be entered in a text input field displayed on the touchscreen. Touchscreen 12 is also used to watch downloaded or streamed videos, or play games, with a user's touch controlling playback of the video or play of the game. In some embodiments, touchscreen 12 is sensitive to a user's touch when the display component of the touchscreen is disabled. While listening to music, a user pauses the music, or advances to the next track of music, by drawing a symbol on touchscreen 12 even though nothing is displayed on the touchscreen.

Buttons 14 provide an alternative user input mechanism to touchscreen 12. Buttons 14 perform functionality depending on the programming of the operating system running on mobile device 10. In one embodiment, buttons 14 return the GUI on touchscreen 12 to a home screen, go back to a previous GUI screen, or open up a menu on the GUI. In other embodiments, the functionality of buttons 14 changes based on a context displayed on touchscreen 12. In one embodiment, buttons 14 are implemented using proximity sensors similar to proximity sensor 11. A user placing a finger on one of buttons 14 modifies the self-capacitance of a sensing element under the button. When proximity is detected, the proximity sensor for the respective button notifies the operating system of mobile device 10 to execute programming associated with the button press.

Speaker 16 provides audible feedback to a user of mobile device 10. When mobile device 10 receives an incoming message, speaker 16 produces an audible notification sound to alert a user to the received message. An incoming telephone call causes a ringing sound from speaker 16 to alert the user. In other embodiments, a musical ringtone, selectable via the GUI on touchscreen 12, is played via speaker 16 when an incoming telephone call is received. When mobile device 10 is used to participate in a telephone call, a user of the mobile device speaks into microphone 17 while the other conversation participants' voices are reproduced by speaker 16. When a user watches a movie or plays a game, the sound associated with the movie or game is produced by speaker 16 for the user to hear.

Front facing camera 18 provides visual feedback to the operating system of mobile device 10. Camera 18 creates a digital image of the area facing touchscreen 12. Camera 18 is used in video chat applications running on mobile device 10 to capture a user's face during a conversation. Mobile device 10 transmits the video of a user to another mobile device in another location, and receives a streaming video of another person using the other mobile device which is displayed on touchscreen 12. Camera 18 is also used to take selfies or other pictures. When camera 18 is used to take pictures, touchscreen 12 displays the image being captured by the camera so that the touchscreen is an electronic viewfinder. Captured photographs are stored on memory within mobile device 10 for subsequent viewing on touchscreen 12, sharing on social networks, or backing up to a personal computer.

Housing 20 provides structural support and protection for the internal components of mobile device 10. Housing 20 is made of rigid plastic or metallic materials to withstand environmental hazards which cause harm to the circuit boards and other components within mobile device 10 if exposed directly. In one embodiment, a panel of housing 20 opposite touchscreen 12 is removable to expose interchangeable parts of mobile device 10 such as a subscriber identification module (SIM) card, flash memory card, or battery. Housing 20 includes a transparent glass or plastic portion over touchscreen 12, which protects the touchscreen from environmental factors while allowing a user's touch to be sensed through the housing.

FIG. 1b illustrates a user 30 operating mobile device 10 as a telephone. User 30 holds mobile device 10 with speaker 16 over an ear of the user. Microphone 17 is oriented toward a mouth of user 30. When user 30 speaks, microphone 17 detects and digitizes the user's voice for transmission to a person the user is speaking with. The person that user 30 is speaking with transmits a digitized voice signal to mobile device 10 which is reproduced on speaker 16 and heard by the user. User 30 thereby converses with another person using mobile device 10.

When user 30 holds mobile device 10 as illustrated in FIG. 1b, proximity sensor 11 notifies the operating system that the user is in proximity. The operating system of mobile device 10 executes code to reduce RF output, disable touchscreen 12, and perform any other actions as programmed.

FIG. 1c illustrates user 30 touching or pressing a button 14. Pressing buttons 14 performs various actions of the operating system depending on the programming of mobile device 10. In one embodiment, user 30 presses a home button to return the display of touchscreen 12 to a home screen.

Proximity sensor 11 and buttons 14 each operate by measuring the self-capacitance of a corresponding sensing element located within mobile device 10. Self-capacitance of a sensing element increases as an object or a body part of user 30 is moved toward the sensing element. Self-capacitance of a sensing element decreases as an object or a body part of user 30 is moved further away from the sensing element. The self-capacitance of a sensing element is compared against a threshold to determine whether user 30 is in proximity to the sensing element. In other embodiments, the self-capacitance value of a sensing element is converted into a measurement of the distance between mobile device 10 and user 30. Measuring the distance of an object from mobile device 10 in a direction perpendicular to touchscreen 12 is known as z-axis detection.

Capacitive touch sensing utilizes shielding planes under the sensing elements to provide directionality of sensing and reduce interference from noise. The shielding planes for capacitive touch sensing are driven by the integrated circuit (IC) which senses the self-capacitance of the sensing elements. A sensing IC drives shielding planes to approximately the same voltage potential as an associated sensing element when detecting proximity. For proximity and z-axis distance of user 30 to be accurately detected, a sensing IC must be able to maintain a shielding plane near the same voltage as a sensing element. When the voltage of a shielding area and a corresponding sensing element are different, the shielding area contributes to the self-capacitance of the sensing area, thus affecting the proximity reading.

One goal of mobile device manufacturers is to provide capacitive touch sensing in multiple areas of a mobile device. Using more proximity sensors located at different locations allows mobile device manufacturers to implement the advanced functionality that consumers demand. However, when proximity sensing is required at distant areas of mobile device 10, using a single proximity sensing integrated circuit becomes challenging. Proximity sensor ICs available on the market include multiple sensing element terminals, but only a single terminal to connect a shielding plane. Driving multiple shielding planes at distant locations of mobile device 10 with a single shield output reduces the ability of a sensing IC to maintain the shielding planes at a voltage close to the voltage of an individual sensing element. The shield terminal is driving a greater load than is actually necessary for measurement of an individual sensing element. Additionally, RF and other interference from one area of mobile device 10 affects sensing in other areas of the mobile device because of the connection of each shielding area to a common shield terminal of the sensing IC.

Multiple sensing ICs can be used to provide an isolated shielding plane for capacitive touch sensing in each area of mobile device 10. However, using multiple sensing ICs takes up additional space on the circuit boards of mobile device 10. As today's consumers demand smaller and thinner mobile devices, circuit board area becomes more valuable and limited. A second goal of manufacturers is to provide consumers with smaller and lighter mobile devices. Using multiple capacitive sensing ICs also increases costs to the manufacturer.

Capacitive sensing ICs on the market today require a tradeoff between goals of mobile device manufacturers. On the one hand, a manufacturer can use multiple sensing ICs to accurately detect proximity of a user at distant areas of a mobile device. Using multiple sensing ICs increases the size and cost of the mobile device. On the other hand, a mobile device manufacturer can use a single sensing IC which only provides a single shield terminal. A single sensing IC with a single shield terminal provides results with reduced accuracy as more shielding planes are used in more areas of the mobile device. A mobile device 10 with less accurate proximity sensors, or fewer proximity sensors, is not able to provide the advanced functionality of other mobile devices.

SUMMARY OF THE INVENTION

A need exists to improve the accuracy of proximity sensing at distant areas of a mobile device without increasing the number of components used. Accordingly, in one embodiment, the present invention is a method of making a proximity sensor comprising the steps of providing a capacitive touch controller, coupling a first shielding area to a first shield terminal of the capacitive touch controller, coupling a second shielding area to a second shield terminal of the capacitive touch controller, disposing a first sensing element adjacent to the first shielding area, and disposing a second sensing element adjacent to the second shielding area.

In another embodiment, the present invention is a method of making a proximity sensor comprising the steps of providing a capacitive touch controller, coupling a first shielding area to a first terminal of the capacitive touch controller, and coupling a second shielding area to a second terminal of the capacitive touch controller.

In another embodiment, the present invention is a proximity sensing circuit comprising a capacitive touch controller. A first shielding area is coupled to a first shield terminal of the capacitive touch controller. A second shielding area is coupled to a second shield terminal of the capacitive touch controller.

In another embodiment, the present invention is a capacitive touch controller comprising a first shield terminal, second shield terminal, and shield control module. A first multiplexer (MUX) selectively couples the first shield output terminal and second shield output terminal to the shield control module.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1A:
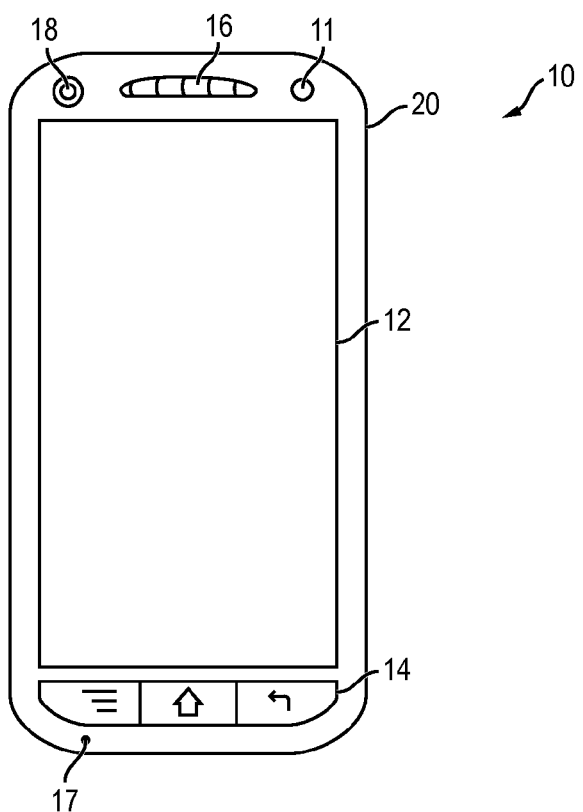
FIGS. 1a-1c illustrate a mobile device with capacitive proximity sensing capability.
Figure 1B:
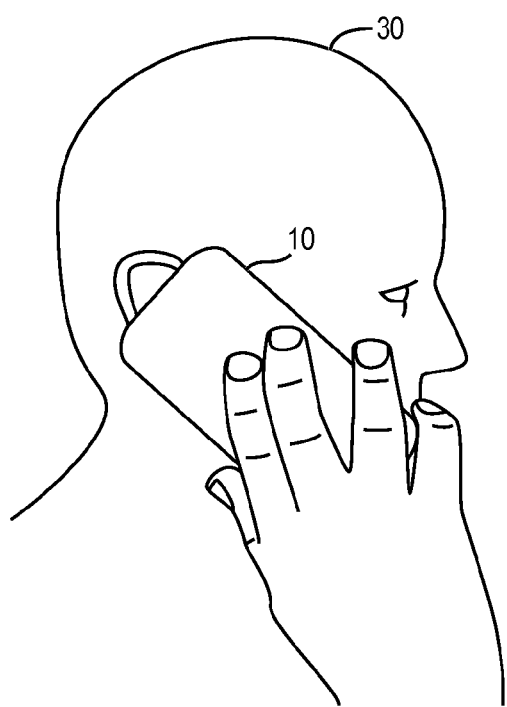
Figure 1C:
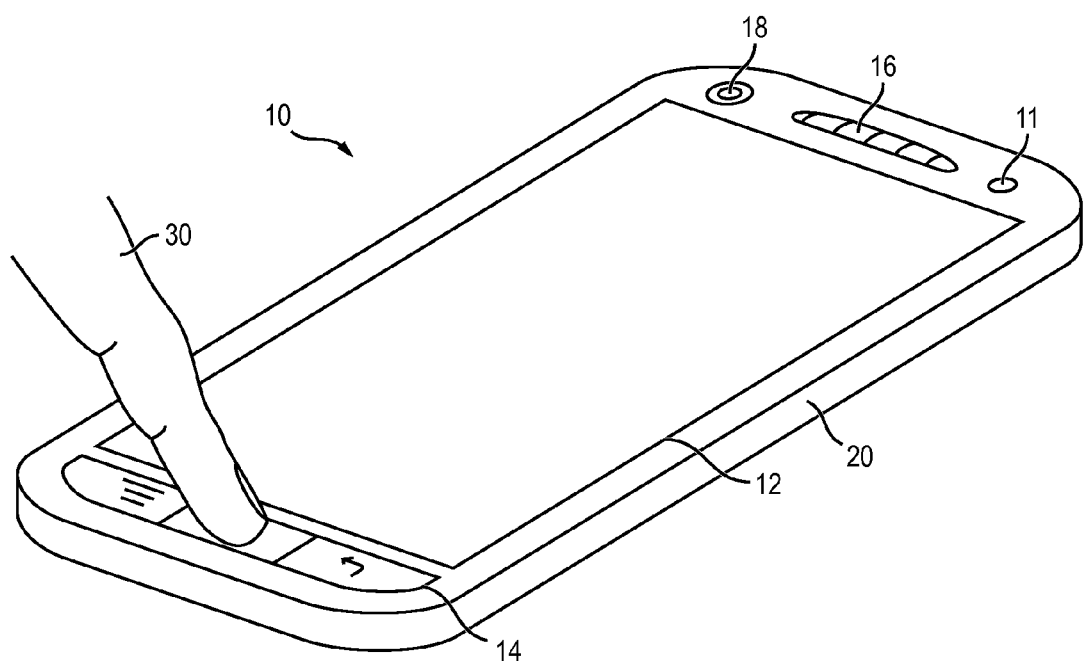
Figure 2A:
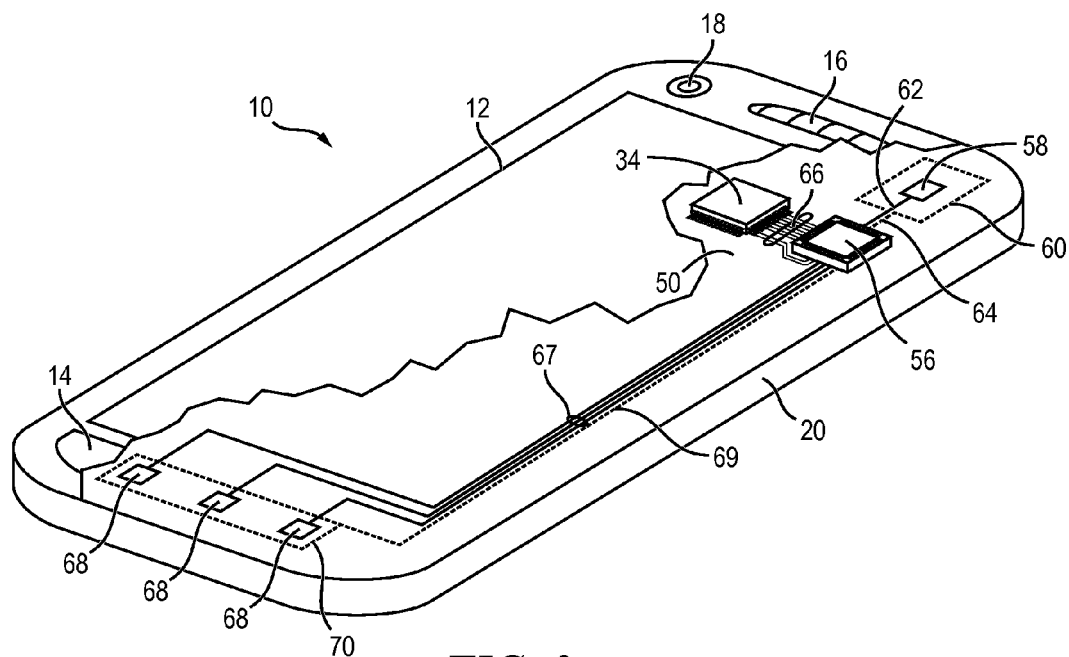
FIGS. 2a-2b illustrate a mobile device including proximity sensors on a circuit board.

FIG. 2a illustrates mobile device 10 with a portion of touchscreen 12 and housing 20 removed to reveal printed circuit board (PCB) 50 with CPU 34, capacitive touch controller 56, sensing element 58, shielding area 60, sensing elements 68, and shielding area 70 formed or disposed on surfaces of the PCB. In other embodiments, a flexible printed circuit (FPC) is used instead of PCB 50. Capacitive touch controller 56 with sensing element 58 forms proximity sensor 11 of mobile device 10. Conductive trace 62 connects sensing element 58 to capacitive touch controller 56, while conductive trace 64 connects shielding area 60 to the capacitive touch controller. Conductive traces 66 provide communication between CPU 34 and capacitive touch controller 56. Sensing elements 68 are formed on PCB 50 under buttons 14 to detect proximity of user 30 to the individual buttons. Each sensing element 68 is connected to capacitive touch controller 56 by a separate conductive trace 67. Conductive trace 69 connects shielding area 70 to capacitive touch controller 56.

PCB 50 provides a base for mounting the electronic parts and forming the conductive traces necessary to provide the functionality of mobile device 10. PCB 50 includes other circuit elements and semiconductor packages not illustrated as required to implement the functionality of mobile device 10. PCB 50 includes all the electronic parts necessary for mobile device 10. In other embodiments, the electronic parts for mobile device 10 are split across multiple PCBs within housing 20. PCB 50 includes additional parts such as a Universal Serial Bus (USB) port, random access memory (RAM), flash memory, a graphics processing unit (GPU), or a system on a chip (SoC).

Capacitive touch controller 56 is an IC designed to measure the self-capacitance, or inherent capacitance, of sensing elements 58 and 68. Self-capacitance is a capacitance measured between a conductive element, e.g., sensing element 58, and a ground potential. When the object to be detected, e.g., a lap, finger, palm, or face of user 30, is not present near a sensing element, the self-capacitance of the sensing element, $C_{SENSOR}$, is the environmental capacitance, $C_{ENV}$. $C_{ENV}$ is determined by electric fields from one of sensing elements 58 and 68 interacting with the environment near the respective sensing element. In particular, electric fields from sensing elements interact with nearby objects such as shielding areas 60 and 70, traces 62, 64, 66, 67, and 69, power and ground planes, conductive vias, and ICs.

When a body part of user 30 is present near a sensing element, the self-capacitance of the sensing element, $C_{SENSOR}$, is $C_{ENV}$ plus the capacitance attributable to the body part, $C_{USER}$. When objects other than a body part of user 30 are detected, $C_{USER}$ is the portion of the self-capacitance of a sensing element attributable to the detected object. Capacitive touch controller 56 is calibrated with a value of $C_{ENV}$ for each sensing element, and subtracts $C_{ENV}$ of a sensing element from the total self-capacitance, $C_{SENSOR}$, of the sensing element. The remaining capacitance is the self-capacitance attributable to a body part of user 30 or another object in proximity of the sensing element, i.e., $C_{USER}$. In practice, a configurable capacitor bank within capacitive touch controller 56 cancels or counteracts the $C_{ENV}$ contribution to self-capacitance, leaving $C_{USER}$ to be measured, although other methods of isolating $C_{USER}$ from $C_{SENSOR}$ are used in other embodiments.

If $C_{USER}$, i.e., the measured self-capacitance of a sensing element attributable to user 30 or another object to be detected, is approximately equal to zero, capacitive touch controller 56 reports to CPU 34 a lack of proximity via a memory mapped flag, as well as an interrupt. If $C_{USER}$ is over a threshold associated with a human body part or other object to be detected, capacitive touch controller 56 reports proximity in a similar manner. In addition to a flag indicating proximity or lack thereof, capacitive touch controller 56 reports to CPU 34 a digital value proportional to $C_{USER}$ for each self-capacitance measurement, whether proximity is detected or not. CPU 34 uses the proximity flag for simple applications where only proximity or lack of proximity is needed, and uses the digital $C_{USER}$ value to implement functionality that is more advanced. In one embodiment, the digital $C_{USER}$ value is used by CPU 34 to determine a distance between user 30 and a particular sensing element. The distance between an object being detected and a sensing element is approximately proportional to the inverse of the measured self-capacitance attributable to the object (distance $\propto 1/C_{USER}$).

Capacitive touch controller 56 senses self-capacitance of sensing elements 58 and 68 by first using a bank of capacitors to cancel $C_{ENV}$, as previously determined for the particular sensing element being measured. The remaining capacitance, $C_{USER}$, is converted to a proportional voltage potential. In some embodiments, the entire self-capacitance of a sensing element, $C_{SENSOR}$, is converted to a proportional voltage and then reduced by a voltage proportional to $C_{ENV}$. The resulting voltage, proportional to $C_{USER}$, is converted to a digital value using an analog-to-digital converter. The digital $C_{USER}$ value is processed to determine whether $C_{USER}$ exceeds a threshold for acknowledging proximity. A proximity flag is set accordingly and made available to CPU 34 for processing. The digital $C_{USER}$ value is also made available to CPU 34.

In one embodiment, capacitive touch controller 56 includes one instance of the hardware sensing module used to measure self-capacitance. Capacitive touch controller 56 measures the self-capacitance of each sensing element 58 and 68 one at a time using a multiplexer inside the capacitive touch controller to control which sensing element is coupled to the sensing module. Capacitive touch controller 56 measures each sensing element in order at approximately the same frequency, or follows other patterns to measure the self-capacitances of the sensing elements with different frequencies and orders.

Sensing elements 58 and 68 are squares of copper formed on a surface of PCB 50, although other shapes and other conductive materials are used for the sensing elements in some embodiments. In other embodiments, any conductive element is used for sensing elements 58 and 68.

Sensing elements 58 and 68 interact with nearby matter, such as conductive traces, vias, and ground planes, as well as a lap, finger, palm, or face of user 30, through electric fields. When a charge is applied to a sensing element 58 or 68, an opposite charge is attracted toward the sensing element within any nearby material. When the amount of material near a sensing element 58 or 68 is increased, a greater amount of electric charge is attracted to the sensing element for a given voltage potential of the sensing element. Thus, the self-capacitance of sensing elements 58 and 68 is a function of the amount of material near each respective sensing element. Conductive material having a conduction path to a circuit node at a ground potential has an increased effect on self-capacitance because the ground node provides a source of additional charge into the conductive material. Sensing elements 58 and 68 attract opposite charge into nearby conductive material through the ground node.

Shielding area 60 is formed on a surface of PCB 50 opposite sensing element 58. Shielding area 60 provides directionality for the sensing capability of sensing element 58, and reduces interference from objects and RF signals on the back side of mobile device 10. Shielding area 60 improves the accuracy of proximity measurements by reducing variations in self-capacitance other than the desired capacitance to be measured, i.e., $C_{USER}$.

Shielding area 60 is electrically connected to capacitive touch controller 56. Capacitive touch controller 56 drives shielding area 60 with a similar voltage potential as sensing element 58 when measuring self-capacitance of sensing element 58. To measure self-capacitance, capacitive touch controller 56 drives a sensing element with a sign wave, square wave, or to multiple discrete voltage levels, and detects the amount of charge required to change the voltage of the sensing element. Charge per volt is a definition of capacitance. Capacitive touch controller 56 drives shielding areas to approximately the same voltage as a sensing element being measured to reduce the effect of the shielding areas on self-capacitance.

In other embodiments, shielding area 60 is electrically connected to a ground potential. Connecting shielding area 60 to ground potential provides an increase to the $C_{ENV}$ component of self-capacitance of sensing element 58. A higher $C_{ENV}$ requires a larger capacitor bank within capacitive touch controller 56 to counteract the higher $C_{ENV}$. Driving shielding area 60 with a similar voltage potential as sensing element 58 provides a lower $C_{ENV}$, and reduces the required size of the capacitor bank within capacitive touch controller 56.

Conductive trace 62 couples sensing element 58 to capacitive touch controller 56. Capacitive touch controller 56 manipulates the voltage of sensing element 58 and detects the self-capacitance of the sensing element via conductive trace 62. Conductive trace 64 couples shielding area 60 to capacitive touch controller 56. Capacitive touch controller 56 controls the voltage of shielding area 60 to be approximately equal to the voltage of sensing element 58 via conductive trace 64.

Conductive traces 66 connect CPU 34 to capacitive touch controller 56. Traces 66 include lines for reset, interrupt, data, address, clock, enable, and other signals necessary for communication between CPU 34 and capacitive touch controller 56. In one embodiment, CPU 34 communicates with capacitive touch controller 56 using the inter-integrated circuit (I²C) protocol. Other communication protocols are used in other embodiments. In some embodiments, the functionality of capacitive touch controller 56 is implemented together with a CPU on a single semiconductor die. In other embodiments, the semiconductor die of both capacitive touch controller 56 and CPU 34 are packaged together in a multi-chip module.

Some functions of capacitive touch controller 56 are controlled by CPU 34 using a single conductive trace 66 connected to a pin on the capacitive touch controller, such as enabling or disabling sensing. Other functionality is exercised by CPU 34 reading from or writing to hardware registers within capacitive touch controller 56. A digital $C_{USER}$ value is read from a memory mapped hardware register internal to capacitive touch controller 56. A register is also used by CPU 34 to set the threshold value of $C_{USER}$ when capacitive touch controller 56 reports proximity. Some functionality is implemented with a discrete input or output pin on capacitive touch controller 56, as well as a hardware register within the capacitive touch controller. Capacitive touch controller 56 is reset by CPU 34 toggling a reset input pin of the capacitive touch controller, or by the CPU writing to a soft reset register within the capacitive touch controller.

Conductive traces 67 connect sensing elements 68 to capacitive touch controller 56. Capacitive touch controller 56 measures the self-capacitance of each sensing element 68 via a respective trace 67. Each sensing element 68 is under and corresponds to one of buttons 14. When the self-capacitance of a sensing element 68 rises above a predetermined threshold, capacitive touch controller 56 reports to CPU 34 that user 30 is in proximity to a sensing element 68. CPU 34 receives a proximity flag from capacitive touch controller 56 and executes code to handle the button press. Capacitive touch controller 56 measures the self-capacitance of each sensing element 58 and 68 one at a time, and reports proximity for each individual sensing element to CPU 34 one at a time.

Shielding area 70 is formed on a surface of PCB 50 opposite sensing elements 68. Shielding area 70 reduces noise from objects and RF interference on a back side of mobile device 10. Shielding area 70 prevents a button press of buttons 14 from being activated when user 30 touches the back side of mobile device 10.

Shielding area 70 is connected to a separate terminal or pin of capacitive touch controller 56 than shielding area 60. Capacitive touch controller 56 is able to separately control shielding area 60 and shielding area 70. Capacitive touch controller 56 drives shielding area 60 to a voltage approximately equal to the voltage of sensing element 58 when measuring the self-capacitance of sensing element 58. When capacitive touch controller is sensing self-capacitance of a sensing element 68, the capacitive touch controller puts shielding area 60 in an inactive state and instead drives shielding area 70. When a shielding area is inactive, capacitive touch controller 56 puts the shielding area in high impedance or drives the shielding area to a static voltage level. When capacitive touch controller 56 is sensing self-capacitance of a sensing element 68, the capacitive touch controller drives shielding area 70 to an approximately equal voltage potential to the particular sensing element 68 being measured. When capacitive touch controller 56 is sensing the self-capacitance of sensing element 58, shielding area 70 is inactive.

Providing shielding areas 60 and 70 connected to separate terminals on capacitive touch controller 56 reduces the load of the shielding areas on the capacitive touch controller. Capacitive touch controller 56 does not drive each shielding area together. Reducing the total shielding load on capacitive touch controller 56 makes shielding areas more responsive to changes in the voltage of a sensing element, providing improved noise cancelling. In addition, separating the connections of shielding areas 60 and 70 to capacitive touch controller 56 reduces the amount by which interference received on one shielding area affects the other shielding area. When the voltage of one shielding area is affected by interference received by another shielding area at a remote location on PCB 50, the effectiveness of the shielding area is reduced. When a shielding area is not at a similar voltage to a corresponding sensing element, the shielding area affects the environmental self-capacitance, $C_{ENV}$, of the sensing element, and the accuracy of measurements is reduced. In addition, having two shielding areas at distant locations of mobile device 10 connected to a single pin of capacitive touch controller 56 creates a trace connecting the shielding areas which acts as an antenna longer than the traces which are otherwise used, increasing the total interference received. Isolating each shielding area with a separate terminal lowers the maximum trace length and reduces interference picked up by the conductive traces.

Figure 2B:
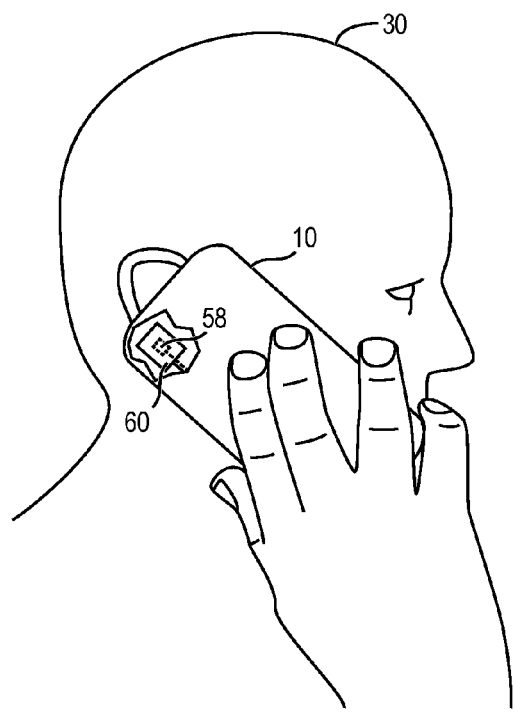

In FIG. 2b, user 30 holds mobile device 10 up to his or her head. The self-capacitance of sensing element 58 increases due to the interaction of electric fields between the sensing element and user 30. Prior to mobile device 10 being disposed in proximity to user 30, the area in front of the mobile device is occupied by air, which has a smaller effect on self-capacitance than the head of the user. Capacitive touch controller 56 detects the rise in self-capacitance of sensing element 58, and notifies CPU 34 of the proximity of user 30. CPU 34 reduces the power output of mobile device 10 accordingly to remain in compliance with SAR regulations. CPU 34 also disables touchscreen 12 to reduce power usage and prevent user 30 from inadvertently activating elements of the touchscreen with his or her face.

Figure 3A:
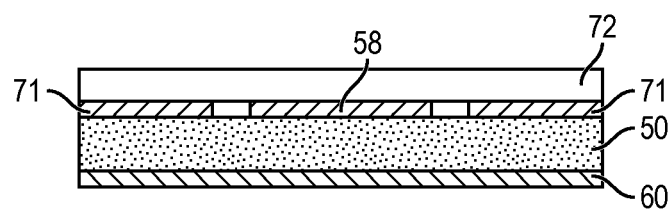
FIGS. 3a-3c illustrate electric fields between a proximity sensing element, surrounding shielding areas, and a human finger.

FIG. 3a is a partial cross-section of PCB 50 illustrating sensing element 58 and optional shielding area 71 formed on a top surface of the PCB. Shielding area 60 is formed on a bottom surface of PCB 50 opposite sensing element 58 and shielding area 71. An optional overlay 72 is formed over sensing element 58 and shielding area 71 for physical isolation and protection of the sensing element.

PCB 50 is formed from one or more layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Electronic components necessary for the functionality of mobile device 10, such as conductive traces and ICs, are formed or disposed on the surfaces of PCB 50. In one embodiment, a multilayer PCB 50 is used which includes electronic components on layers between a top and bottom surface of the PCB. Components on different layers or surfaces of PCB 50 are connected by conductive vias formed in the PCB.

Sensing element 58 and shielding area 71, as well as conductive traces 62, 64, 66, 67, and 69 are formed as a layer of metal on PCB 50. In one embodiment, sensing element 58, shielding area 71, and the conductive traces are formed from a single uniform layer of metal using subtractive methods such as silk screen printing, photoengraving, or PCB milling. In other embodiments, an additive or semi-additive method such as physical vapor deposition (PVD), chemical vapor deposition (CVD), electrolytic plating, electroless plating, or another suitable metal deposition process is used. Shielding area 60 is formed from a similar process as sensing element 58 and shielding area 71.

Sensing element 58, shielding area 71, shielding area 60, and conductive traces 62, 64, 66, 67, and 69 include one or more layers of aluminum (Al), copper (Cu), tin (Sn), nickel (Ni), gold (Au), silver (Ag), indium tin oxide (ITO), printed conductive ink, or other suitable electrically conductive material. Traces 62, 66, and 67 are formed on the same surface of PCB 50 as sensing element 58. Traces 64 and 69 connect shielding areas 60 and 70, respectively, on the opposite surface of PCB 50. As such, traces 64 and 69 are formed partially on each side of PCB 50. A conductive via connects portions of traces 64 and 69 on opposite sides of PCB 50.

In some embodiments, traces 62, 66, and 67 are formed on the surface of PCB 50 opposite sensing element 58 or on an intermediate layer when a multilayer PCB is used. Conductive vias are used where needed to connect traces to CPU 34, capacitive touch controller 56, sensing element 58, and sensing elements 68 when the traces are not formed on the same surface. A conductive via connects shielding area 71 to shielding area 60 so that capacitive touch controller 56 drives both shielding areas to a similar voltage potential.

Shielding areas 60 and 71 provide a noise blocking function, as well as directionality for sensing element 58. Shielding areas 60 and 71 provide an electromagnetic shield substantially surrounding sensing element 58 in each direction other than the direction which sensing is desired. Electric fields from sensing element 58 interact with shielding areas 60 and 71, which have a stable effect on self-capacitance, instead of other objects opposite the shielding areas which have a dynamic capacitance with respect to the sensing element. Shielding areas 60 and 71 also reduce electromagnetic noise which impacts the accuracy of the detected capacitance.

Shielding area 71 helps reduce noise from surrounding components of mobile device 10 which are also disposed on PCB 50. In one embodiment, a plurality of conductive vias are provided between shielding areas 60 and 71 to further improve noise immunity in lateral directions from sensing element 58. In some embodiments, shielding area 60 is provided along with conductive vias through PCB 50 to provide lateral noise immunity without shielding area 71. In other embodiments, shielding area 60 is curved, bent, or otherwise includes a vertical component through PCB 50 to reduce interference between sensing element 58 and other components of mobile device 10. Shielding area 70 is formed and operates similarly to shielding area 60.

Figure 3B:
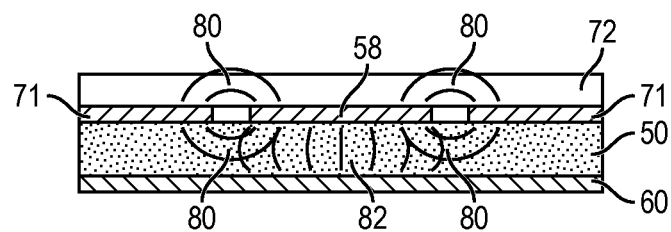
Figure 3C:
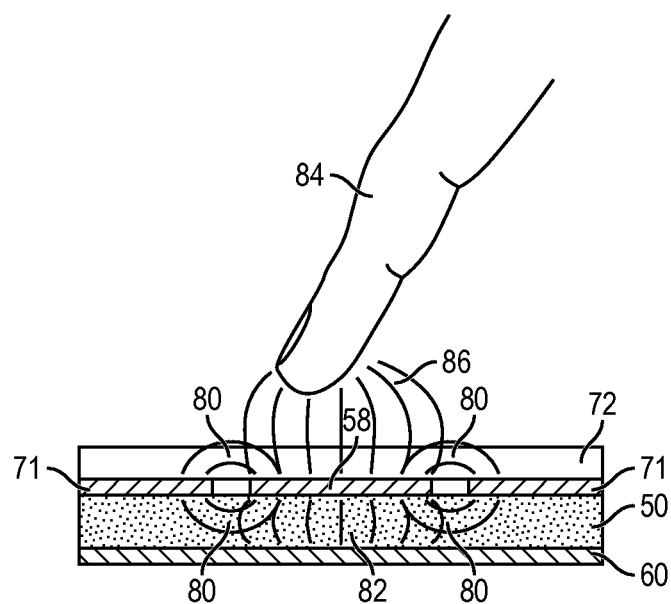

With shielding areas 60 and 71 surrounding sensing element 58 on the bottom and sides, as illustrated in FIGS. 3a-3c, a body part is detected when disposed over sensing element 58 opposite shielding area 60. Shielding area 60 limits the detection capability of capacitive touch controller 56 when a finger or other body part of user 30 is disposed on the back side of PCB 50, i.e., on the opposite side of the PCB from sensing element 58. Shielding area 60 improves accuracy of measuring self-capacitance of sensing element 58 by providing a steadier $C_{ENV}$, so that $C_{USER}$ is more accurately isolated from $C_{SENSOR}$ and measured.

Shielding areas 60 and 71 are electrically connected to capacitive touch controller 56. Capacitive touch controller 56 drives shielding areas 60 and 71 to a similar voltage potential as sensing element 58 when sensing self-capacitance of sensing element 58. In other embodiments, shielding areas 60 and 71 are electrically connected to a ground potential. Connecting shielding areas 60 and 71 to ground potential provides an increase to the $C_{ENV}$ component of self-capacitance of sensing element 58 due to ground providing a source of charges attracted to the sensing element. A higher $C_{ENV}$ requires a larger capacitor bank within capacitive touch controller 56 to counteract the higher $C_{ENV}$.

Capacitive touch controller 56 driving shielding areas 60 and 71 to a similar voltage potential as sensing element 58 reduces self-capacitance of sensing element 58 by reducing the amount of charge the sensing element attracts in the shielding areas.

Overlay 72 provides physical isolation and protection for sensing element 58. Overlay 72 increases the robustness of mobile device 10 by protecting sensing element 58 from environmental hazards such as dust, dirt, rain, and wind. In one embodiment, overlay 72 is a sheet of plastic or glass integrated into housing 20. Overlay 72 is translucent, transparent, or opaque. Overlay 72 is formed from a material with an electric field permittivity sufficient to allow electric fields to propagate between sensing element 58 and a body part of user 30 or another object disposed in proximity to the sensing element. A similar overlay formed over sensing elements 68 includes patterned designs to indicate to user 30 the location and function of buttons 14.

FIG. 3b illustrates electric fields between sensing element 58 and shielding areas 60 and 71 when no human body part is in proximity of the sensing element. Electric fields 80 extend between sensing element 58 and shielding area 71. Electric fields 82 extend between sensing element 58 and shielding area 60. Electric fields 80 and 82 are simplified illustrations of the electric fields interacting with sensing element 58. In practice, the electric fields are complex and extend not only to shielding areas 60 and 71, but also to any conductive material, such as conductive vias or conductive traces, near sensing element 58. The environmental self-capacitance, $C_{ENV}$, of sensing element 58 is a measure of electric fields 80 and 82 from the sensing element interacting with shielding areas 60 and 71 and other conductive material in proximity to the sensing element when user 30 is not in proximity.

When a charge exists on sensing element 58, electric fields 80 and 82 attract an opposite charge within nearby conductive material. A negative charge exists when there is an excess of electrons in the atoms of an object compared to the number of protons. A positive charge exists when there is a deficit of electrons compared to the number of protons. Negatively charged material attracts positive charge, and positively charged material attracts negative charge. When a first object has a positive charge, electrons in nearby conductive objects are attracted to the first object, creating an area of negative charge in the nearby objects. When a first object has a negative charge, electrons in nearby conductive objects are repelled, creating an area of positive charge in the nearby objects. A negative charge and a positive charge are opposites.

In FIG. 3c, finger 84 of user 30 is in the proximity of sensing element 58. While a finger is illustrated, a lap, palm, face, or other object, for example a desk or chair, is also capable of being detected. Electric fields 86 attract a charge to the tip of finger 84 that is the opposite of a charge on sensing element 58. The additional charge attracted in finger 84 raises the total amount of charge that must be supplied to sensing element 58 by capacitive touch controller 56 to reach a given voltage potential of the sensing element. As charge per volt is a formula defining capacitance, additional conductive material with additional charge attracted to sensing element 58 raises the self-capacitance of the sensing element. In FIG. 3c, $C_{ENV}$ is represented by electric fields 80 and 82, $C_{USER}$ is represented by electric fields 86, and $C_{SENSOR}$ is the sum of $C_{ENV}$ and $C_{USER}$.

Capacitive touch controller 56 measures that the self-capacitance of sensing element 58, and thus $C_{USER}$, has risen. A flag is set within a hardware register of capacitive touch controller 56, and the capacitive touch controller asserts an interrupt signal to CPU 34. CPU 34 receives the interrupt and executes program code associated with a new proximity reading of proximity sensor 11. In the case of mobile device 10, CPU 34 executes code which reduces RF power output and disables touchscreen 12.

Capacitive touch controller 56 measures a distance of finger 84 from sensing element 58 as well as detecting proximity or lack thereof. The closer finger 84 is to sensing element 58, the greater the effect of finger 84 on the self-capacitance of the sensing element. Capacitive touch controller 56 isolates $C_{USER}$, i.e., the contribution of finger 84 to the self-capacitance of sensing element 58, and uses a formula to translate $C_{USER}$ into a distance. In other embodiments, CPU 34 reads a value of the self-capacitance of sensing element 58 from a register in capacitive touch controller 56 and converts the self-capacitance value to a distance. Providing an accurate distance measurement based on the self-capacitance of sensing elements 58 requires shielding areas 60 and 71 to effectively reduce variations of $C_{ENV}$ over time. Sensing elements 68 are formed and operate similarly to sensing element 58.

In some embodiments, multiple sensing elements are disposed spread out behind touchscreen 12 to provide feedback to CPU 34 regarding the distance of user 30 from the touchscreen, i.e., in the z-axis direction. Capacitive touchscreens often use differential or mutual capacitive sensing to determine the position of user 30 relative to touchscreen 12. Rows and columns of mutual capacitive sensing elements determine the position of user 30 in the x and y axes. The x-axis of touchscreen 12 extends from the left side to the right side of the touchscreen, while the y-axis extends from the bottom (near buttons 14) to the top (near speaker 16) of the touchscreen. Mutual inductance touch sensors are accurate in the x and y direction, but do not give accurate readings of the position of user 30 in the z direction. The z-axis extends out from touchscreen 12 toward user 30 in a direction perpendicular to the touchscreen.

Adding sensing elements under touchscreen 12 which utilize self-capacitance adds z-axis detection to an existing touchscreen. Self-capacitance sensors have more accurate z-axis detection than sensors utilizing mutual capacitance. Self-capacitive sensing elements added under touchscreen 12 allow CPU 34 to receive feedback on the position of a body part of user 30 in the x, y, and z-axes. Three dimensional positional sensing allows richer interaction of user 30 with mobile device 10, and more advanced functionality of the mobile device. In one embodiment, z-axis feedback enabled by self-capacitive sensing elements under touchscreen 12 allows user 30 to control a game played on mobile device 10 by moving finger 84 in three dimensions above the touchscreen.

Figure 4:
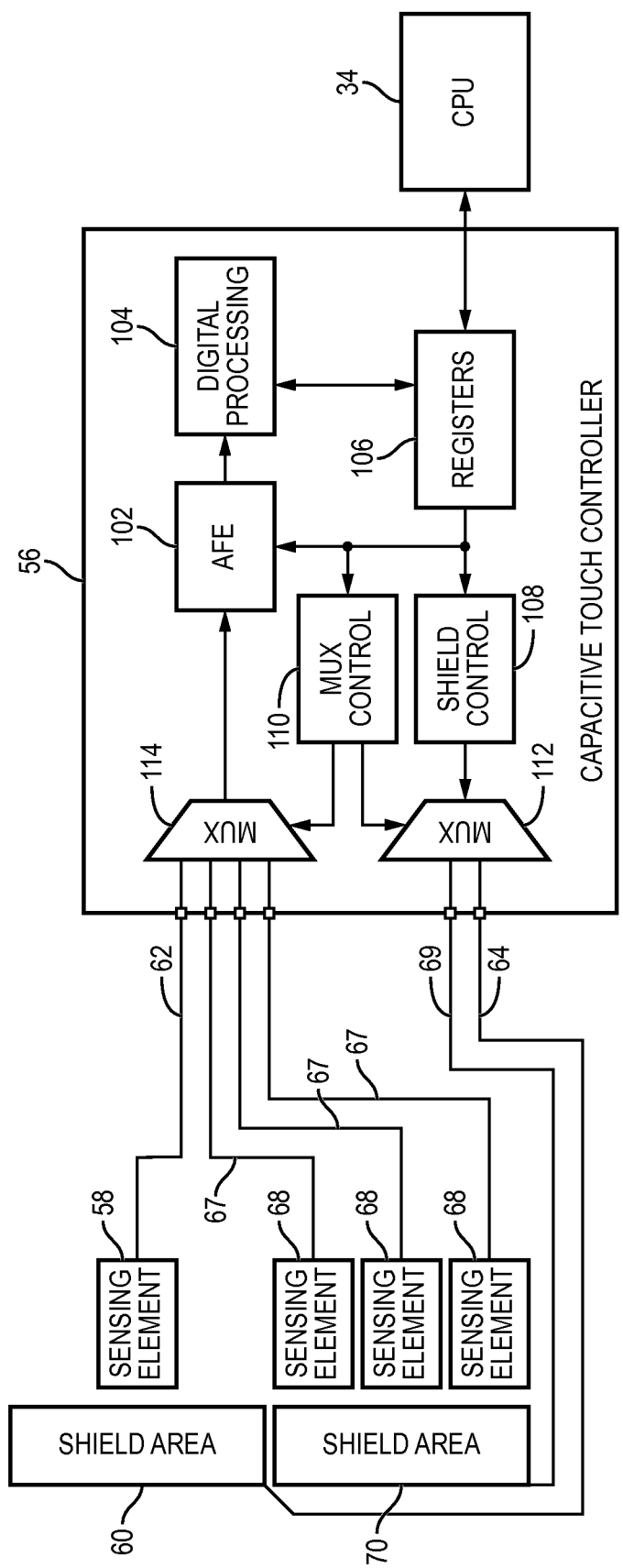
FIG. 4 illustrates a capacitive touch controller including four sensing terminals and two shield terminals.

FIG. 4 is a block diagram of the internal components of capacitive touch controller 56 used to operate multiple shielding areas and multiple sensing elements. Analog front-end (AFE) 102 detects the self-capacitance of sensing elements 58 and 68 and outputs a digital value of the self-capacitance to digital processing unit 104. Registers 106 include various hardware registers used by capacitive touch controller 56 to report information to CPU 34, and by the CPU to configure the capacitive touch controller. Shield control 108 enables or disables shielding areas, and drives enabled shielding areas to a similar voltage potential as a sensing area being measured. Multiplexer (MUX) control 110 controls which shielding area is coupled to shield control 108 by MUX 112, and which sensing element is coupled to AFE 102 by MUX 114.

AFE 102 includes a configurable bank of capacitors which are adjusted to approximately cancel the effect of $C_{ENV}$ so that capacitance due to the proximity of external objects, $C_{USER}$, is isolated and accurately measured. $C_{USER}$ is the portion of self-capacitance of a sensing element 58 or 68 attributable to a body part of user 30 or other object to be detected.

A digital value from registers 106 configures the bank of capacitors in AFE 102 based on a prior reading of $C_{ENV}$. The configurable capacitor bank in AFE 102 is used to generate a voltage approximately proportional to a previously detected $C_{ENV}$. AFE 102 also generates a voltage approximately proportional to $C_{SENSOR}$, i.e., the total self-capacitance of a sensing element 58. AFE 102 subtracts the voltage proportional to $C_{ENV}$ from the voltage proportional to $C_{SENSOR}$ to produce a voltage approximately proportional to $C_{USER}$. The voltage proportional to $C_{USER}$ is converted to a digital value by an analog-to-digital converter within AFE 102 and output to digital processing unit 104.

Digital processing unit 104 receives a digital value approximately proportional to $C_{USER}$ of a sensing element 58 or 68 from AFE 102 and writes the value to a hardware register in registers 106. The digital $C_{USER}$ value written to a register in registers 106 is available to CPU 34 by reading the register. Registers 106 include one register per available sensing terminal of capacitive touch controller 56. CPU 34 reads the most recent $C_{USER}$ reading of any sensing element by reading the corresponding register. A different digital value, stored in a hardware register of registers 106 and configured by CPU 34, indicates a threshold $C_{USER}$ must reach in order for capacitive touch controller 56 to report proximity to CPU 34. If the digital $C_{USER}$ value from AFE 102 exceeds the threshold value from registers 106, digital processing unit 104 causes a proximity status flag in registers 106 to become a logic '1', and CPU 34 is interrupted for handling of the proximity event. In one embodiment, registers 106 include a separate threshold register for each available sensing terminal of capacitive touch controller 56.

Digital processing unit 104 stores a digital value of $C_{USER}$ in registers 106 each time the self-capacitance of a sensing element 58 or 68 is converted to a new $C_{USER}$ value. In one embodiment, digital processing unit 104 stores the raw $C_{USER}$ value from AFE 102 in registers 106. In other embodiments, digital processing unit 104 adjusts the $C_{USER}$ value before storage in registers 106, e.g., by adjusting $C_{USER}$ for drift of $C_{ENV}$ or by filtering high frequency noise.

Registers 106 include various memory mapped hardware registers used by CPU 34 to configure capacitive touch controller 56, or by the capacitive touch controller to report proximity and other information to the CPU. Some hardware registers of registers 106 are set by a manufacturer for configuration aspects which the manufacturer desires to set permanently for the lifetime of mobile device 10, or until modified by a manufacturer's update. Registers 106 include interrupt request (IRQ) bits used to notify CPU 34 when the proximity status of user 30 has changed, i.e., the user has entered or left the proximity of a sensing element 58 or 68. Registers 106 also include IRQ bits for completion of a new $C_{USER}$ reading or a new calibration of $C_{ENV}$. Registers 106 are used by CPU 34 to set a threshold value of $C_{USER}$ when proximity is considered detected, to reset capacitive touch controller 56, and to set a frequency at which periodic capacitance readings are to occur for each individual sensing element, among other uses.

Registers 106 include registers which store a calibration value for each sensing element 58 and 68. The calibration value configures the capacitor bank in AFE 102 to properly cancel out $C_{ENV}$ for each individual sensing element. Capacitive touch controller 56 runs a calibration routine after a reset of the capacitive touch controller, and periodically thereafter. During the calibration routine, capacitive touch controller 56 uses a dichotomy algorithm to try different values for configuring the capacitor bank in AFE 102 until a detected $C_{USER}$ value stored in registers 106 is approximately equal to zero. A configuration value of the capacitor bank in AFE 102 which results in a $C_{USER}$ reading of approximately zero when user 30 is not in proximity of a sensing element properly calibrates AFE 102 to eliminate $C_{ENV}$ from $C_{SENSOR}$ and isolate $C_{USER}$. The dichotomy algorithm is executed with each sensing element 58 and 68 individually coupled to AFE 102 to configure registers 106 with a valid calibration value for each sensing element.

Shield control 108 enables or disables shielding areas 60 or 70 depending on which sensing element 58 or 68 is being read. CPU 34 sets a register in registers 106 to enable or disable shield functionality for each individual sensing element. When capacitive touch controller 56 is sensing the self-capacitance of a sensing element, shield control 108 determines which sensing element is being detected and enables or disables shielding depending on the configuration in registers 106. In one embodiment, shielding is disabled for a set of sensing elements where accurate z-axis measurement is not required, or omnidirectional sensing is desired. Shielding remains enabled for other sensing elements. When shielding is enabled, shield control 108 uses a buffer to drive an output to approximately the same voltage as a sensing element being measured. When shielding is disabled or inactive, shield control 108 provides the output at a high impedance or at a static voltage level.

MUX control 110 controls which sensing element 58 or 68 is coupled to AFE 102. MUX control 110 drives a select input of MUX 114 based on a sensing pattern configured in registers 106. In one embodiment, capacitive touch controller 56 is configured to read each sensing element 58 and 68 in a particular order repeatedly. Each sensing element is measured at approximately the same frequency. In other embodiments, CPU 34 configures capacitive touch controller 56 to measure the self-capacitance of sensing elements 68 at a first frequency, different than the frequency of the measurements of sensing element 58. In one embodiment, CPU 34 sets a specific order or pattern of measuring sensing elements 58 and 68. In other embodiments, CPU 34 sets a desired frequency for measurements of each sensing element, and MUX control 110 uses an algorithm to determine when to enable each sensing element.

MUX control 110 controls which of shielding areas 60 and 70 is coupled to shield control 108. MUX control 110 drives a select input of MUX 112 to couple either shielding area 60 or shielding area 70 to shield control 108. In one embodiment, CPU 34 uses registers 106 to assign each sensing terminal of capacitive touch controller 56 to a shielding pin or terminal of the capacitive touch controller. MUX control 110 sets the select input of MUX 112 based on which shielding area is associated with the sensing element currently being measured.

Capacitive touch controller 56 measures the self-capacitance of each sensing element 58 and 68 one at a time. First, MUX control 110 reads registers 106 to determine what order to enable the sensing elements and which shielding area is associated with each sensing element. MUX control 110 toggles control lines to MUX 114 to couple the proper sensing element 58 or 68 to AFE 102. MUX control 110 toggles control lines to MUX 112 to couple the proper shielding area 60 or 70 to shield control 108. Shield control 108 determines whether a shielding area is enabled for the current sensing element. If a shielding area is enabled in registers 106 for the sensing element being measured, shield control 108 couples MUX 112 to the output of AFE 102 via a buffer. The buffer in shield control 108 drives the shield control output to MUX 112 at approximately the same voltage as the AFE 102 output to MUX 114 while also providing isolation of the shielding components from the sensing components. If a shielding area is disabled in registers 106 for the sensing element being measured, shield control 108 puts the output of the shield control to MUX 112 in a high impedance state, or drives the output to a static voltage level.

With the proper sensing element to be measured coupled to AFE 102 through MUX 114, and the proper shielding area coupled to shield control 108 through MUX 112, AFE 102 commences measuring the self-capacitance of the connected sensing element. AFE 102 drives the sensing element 58 or 68 to varying DC voltages and measures the amount of charge required for the sensing element to reach the voltage level. In one embodiment, AFE 102 drives the sensing element 58 or 68 with an alternating current (AC) voltage. In other embodiments, other methods of determining the self-capacitance of a conductive object are used.

Internally, AFE 102 generates a voltage potential approximately proportional to the self-capacitance of the connected sensing element 58 or 68, $C_{SENSOR}$. AFE 102 also uses a previously stored digital value of $C_{ENV}$ to generate a voltage approximately proportional to the environmental self-capacitance of the sensing element. AFE 102 subtracts the voltage proportional to $C_{ENV}$ from the voltage proportional to $C_{SENSOR}$ to generate a voltage approximately proportional to the amount of self-capacitance attributable to user 30, $C_{USER}$. AFE 102 includes an analog-to-digital converter which creates a digital value equivalent to the analog $C_{USER}$ voltage. The digital $C_{USER}$ value is output to digital processing unit 104.

Digital processing unit 104 receives the digital $C_{USER}$ value from AFE 102 and performs any desired digital processing on the value. In one embodiment, digital processing unit 104 adjusts the $C_{USER}$ value for drift of $C_{ENV}$ due to shift in temperature or other environmental variables. Digital processing unit 104 stores the adjusted $C_{USER}$ value in a register of registers 106 associated with the sensing element currently coupled to AFE 102 by MUX 114. Capacitive touch controller 56 interrupts CPU 34 to alert the CPU that a new self-capacitance measurement is complete.

The self-capacitance measuring process begins again, with MUX control 110 determining the next sensing element to be measured based on settings in registers 106. MUX control 110 couples the next sensing element to be measured to AFE 102 using MUX 114, and couples the associated shielding area to shield control 108 via MUX 112. AFE 102 generates a digital value proportional to the $C_{USER}$ of the newly coupled sensing element, and digital processing unit 104 adjusts the value before storage in registers 106. CPU 34 is again interrupted and MUX control 110 couples the next sensing element to AFE 102.

Shielding area 60 and shielding area 70 are separately coupled to capacitive touch controller 56 using separate conductive traces and separate pins or terminals on the capacitive touch controller. Isolating shielding area 60 from shielding area 70 reduces the load on shield control 108 when driving a shielding area. A reduced load on shield control 108 allows the voltage of a shielding area to change more quickly as the voltage of a sensing element being measured changes. When a shielding area is not at the same voltage as a sensing element, the shielding area affects the environmental capacitance, $C_{ENV}$, of the sensing element. Keeping a shielding area at a voltage closer to the voltage of a sensing element provides for a steadier $C_{ENV}$ component of self-capacitance. When fluctuations in $C_{ENV}$ are reduced, AFE 102 is more accurate in cancelling the environmental contribution to self-capacitance, and a more accurate $C_{USER}$ value is isolated and stored in registers 106.

Isolating shielding area 60 and shielding area 70 also reduces the amount by which interference received by one shielding area affects readings of the self-capacitance of sensing elements associated with other shielding areas. When AFE 102 is measuring the self-capacitance of sensing element 58, interference picked up by shielding area 70 and trace 69 flows to MUX 112. MUX 112 does not significantly propagate the interference from trace 69 to trace 64 and shielding area 60, which would affect the $C_{ENV}$ of sensing element 58. The accuracy of measurements of sensing element 58 is not significantly reduced by interference received on shielding area 70 and trace 69. With shielding area 60 and shielding area 70 at distant locations on PCB 50, a trace coupling both shielding areas to a single pin of capacitive touch controller 56 acts as an antenna, with the long trace picking up RF interference affecting readings of all sensing elements associated with either shielding area. Isolating shielding areas 60 and 70 using separate pins on capacitive touch controller 56 reduces RF interference because shorter traces are less affected by RF radiation, and because interference in one shielding area does not significantly affect the other shielding area.

Figure 5A:
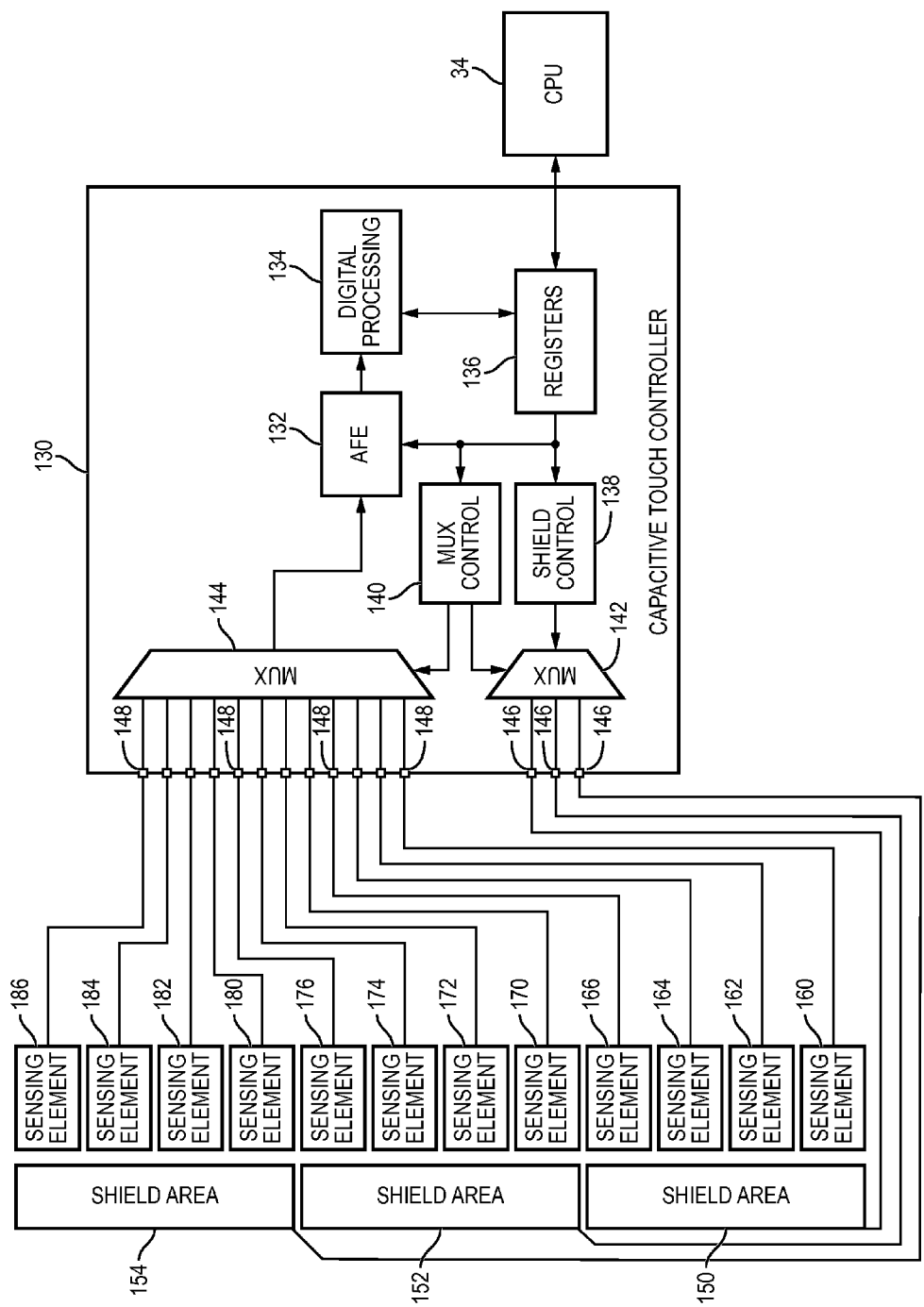
FIGS. 5a-5b illustrates a capacitive touch controller including twelve configurable sensing terminals with three shield terminals.

FIG. 5a illustrates capacitive touch controller 130. Capacitive touch controller 130 operates similarly to capacitive touch controller 56, but capacitive touch controller 130 includes capability to measure the self-capacitance of twelve different sensing elements and utilizes up to three separate shielding areas. AFE 132 of capacitive touch controller 130 operates similarly to AFE 102 of capacitive touch controller 56. Digital processing unit 134 operates similarly to digital processing unit 104. Registers 136 operate similarly to registers 106. Shield control 138 operates similarly to shield control 108. MUX control 140 operates similarly to MUX control 110. MUX 142 operates similarly to MUX 112, but MUX 142 provides an additional shield output port for capacitive touch controller 130. MUX 144 operates similarly to MUX 114, but provides for twelve sensing element connections to capacitive touch controller 130 as opposed to the four connections provided by MUX 114. Capacitive touch controller 130 in FIG. 5a is connected to three shielding areas 150-154 and twelve sensing elements 160-186. Each individual shielding area 150-154 operates similarly to shielding areas 60 and 70. Each individual sensing element 160-186 operates similarly to sensing elements 58 and 68.

AFE 132 detects the total self-capacitance of a sensing element 160-186, $C_{SENSOR}$. AFE 132 then eliminates the portion of self-capacitance attributable to environmental factors, $C_{ENV}$, to isolate the portion of self-capacitance attributable to user 30 or another object, $C_{USER}$. AFE 132 converts $C_{USER}$ to a digital value and sends the digital value to digital processing unit 134. Digital processing unit 134 performs digital processing on the $C_{USER}$ value and then stores the value in registers 136 so that CPU 34 can read the value. Each $C_{USER}$ reading is stored in a register of registers 136 corresponding to the specific sensing terminal 148 used to make the capacitance reading. CPU 34 configures capacitive touch controller 130 to interrupt the CPU when each sensing element has been measured, or when each grouping has completed. In other embodiments, CPU 34 disables interrupts and polls status registers in registers 136 to determine when new measurements are available.

Registers 136 include registers for configuring the shielding areas and sensing elements connected to capacitive touch controller 130. Each individual sensing terminal or pin 148 is enabled or disabled by CPU 34 writing to a memory mapped registers in registers 136. If a manufacturer is utilizing twelve different sensing elements, as shown in FIG. 5a, CPU 34 writes to registers 136 and enables all twelve sensing terminals 148. If less than twelve sensing elements are used, some sensing terminals 148 are disabled in registers 136 so that capacitive touch controller 130 does not attempt to measure the self-capacitance on terminals which do not have sensing elements connected.

Registers 136 include registers to associate each individual sensing terminal 148 with a specific shield terminal 146. In FIG. 5a, four sensing terminals 148 are associated with each shield terminal 146. In embodiments where less than three shielding areas are used, no sensing terminals 148 are associated with one of the shield terminals 146. When no sensing terminals 148 are associated with a specific shield terminal 146, that particular shield terminal 146 is not coupled to shield control 138 by MUX 142 during measurement of any sensing terminal 148. In other embodiments, registers 136 include a register to enable or disable individual shield terminals 146.

Registers 136 include registers to configure the order or frequency for capacitive touch controller 130 measuring the self-capacitance of each sensing element. In one embodiment, CPU 34 programs capacitive touch controller 130 to measure each sensing terminal 148 in order as fast as possible. All twelve sensing terminals 148 are measured at approximately the same frequency in order. In other embodiments, sensing elements 160-166 are used for a purpose which does not require rapid detection of proximity. CPU 34 programs registers 136 so that sensing elements 160-166 are measured once every second. Capacitive touch controller 130 continues to measure the self-capacitance of sensing elements 170-186 as fast as possible between measurements of sensing elements 160-166 every second. Other patterns and configurations for setting the frequency of measuring each sensing terminal 148 are used in other embodiments. Each individual sensing element 160-186 is configured individually for a different measurement frequency. The sensing terminals 148 are also grouped based on associations with shielding areas 150-154, and a measurement frequency is set for each grouping of sensing elements.

Registers 136 include a calibration register for each sensing terminal 148. The calibration register values are determined by capacitive touch controller 130 as a value which configures a capacitor bank in AFE 132 to counteract the $C_{ENV}$ of each particular sensing element. The calibration registers are populated using a dichotomy algorithm, similarly to registers 106. In some embodiments, where not all sensing terminals 148 are coupled to sensing elements, capacitive touch controller 130 does not execute the dichotomy algorithm to determine a calibration value for the sensing terminals which do not have sensing elements connected.

Shield control 138 drives an output to MUX 142 with approximately the same voltage potential as the signal from AFE 132 to MUX 144. A buffer drives the output of shield control 138 while isolating AFE 132 from the shielding components. In one embodiment, shield control 138 always drives an output to a similar voltage as AFE 132 is driving to MUX 144. When a sensing terminal 148 which is not associated with a shield terminal 146 is being measured, shield control 138 drives an output to MUX 142, but MUX 142 does not couple shield control 138 to a shield terminal 146. In other embodiments, shield control 138 is disabled when measuring a sensing element not associated with a shielding area. In some embodiments, CPU 34 configures one sensing element 160-186 to be associated with multiple shielding areas 150-154. MUX 142 allows two sensing terminals 146 to be coupled to shield control 138 so that multiple shielding areas are combined for a single sensing element.

MUX control 140 reads a configuration from registers 136 and operates select inputs of MUX 142 and MUX 144 to execute the pattern or order of measuring sensing terminals 148 set by CPU 34. MUX 142 includes a connection to each shield terminal 146 of capacitive touch controller 130. MUX 142 couples one of the shield terminals 146 to shield control 138. A select input to MUX 142 from MUX control 140 controls which shield terminal 146 is coupled to shield control 138 at any given moment. MUX 144 includes a connection to each sensing terminal 148 of capacitive touch controller 130. MUX 144 couples one of the sensing terminals 148 to AFE 132. A select input to MUX 144 from MUX control 140 controls which sensing terminal 148 is coupled to AFE 132 at any given moment.

MUX control 140 controls MUX 142 and MUX 144 to couple a single sensing element 160-186 to AFE 132 and between zero and three associated shielding areas 150-154 to shield control 138. Once AFE 132 and digital processing unit 134 have measured the self-capacitance of the connected sensing element and stored the value in registers 136, MUX control 140 toggles the select inputs of MUX 142 and MUX 144 to connect the next sensing element to be measured. MUX control 140 continues selecting a different sensing element and waiting until a digital $C_{USER}$ value of the self-capacitance is stored in registers 136. Once a $C_{USER}$ value for each sensing element has been stored in registers 136, MUX control 140 repeats the pattern, with each sensing element being measured one at a time to overwrite the old $C_{USER}$ values in registers 136 with new $C_{USER}$ values. In other embodiments, CPU 34 configures capacitive touch controller 130 to follow other patterns for measuring the self-capacitance of sensing elements 160-186.

Capacitive touch controller 130 allows multiple groupings of sensing elements to be used at distant locations in mobile device 10, with a separate shielding area used for each grouping of sensing elements, without requiring multiple sensing integrated circuits. A single capacitive sensing circuit, i.e., AFE 132, is used for all sensors and sensor groups by time multiplexing the sensing operations. Using a single capacitive sensing circuit for all sensor groupings reduces the physical area required to implement the sensing functionality, thus reducing cost to a manufacturer of mobile device 10.

Using individual shielding areas for different sensor groups reduces the sensitivity of each sensor group to noise, and isolates the sensor groups from each other by not using one large common shield. Noise picked up by one shielding area is not transferred between groups of sensing elements to cause interference in the other groups. The improved performance of individual shielding areas versus one large common shield improves the accuracy of sensing elements by improving the environmental noise rejection of shielding. Because the load on shield control 138 is reduced for each sensing element being measured, the shield control operates more quickly in driving a shielding area to a similar voltage potential as a sensing element, and requires less power.

Capacitive touch controller 130 provides a low cost, single chip solution with low complexity and high usage flexibility.

Figure 5B:
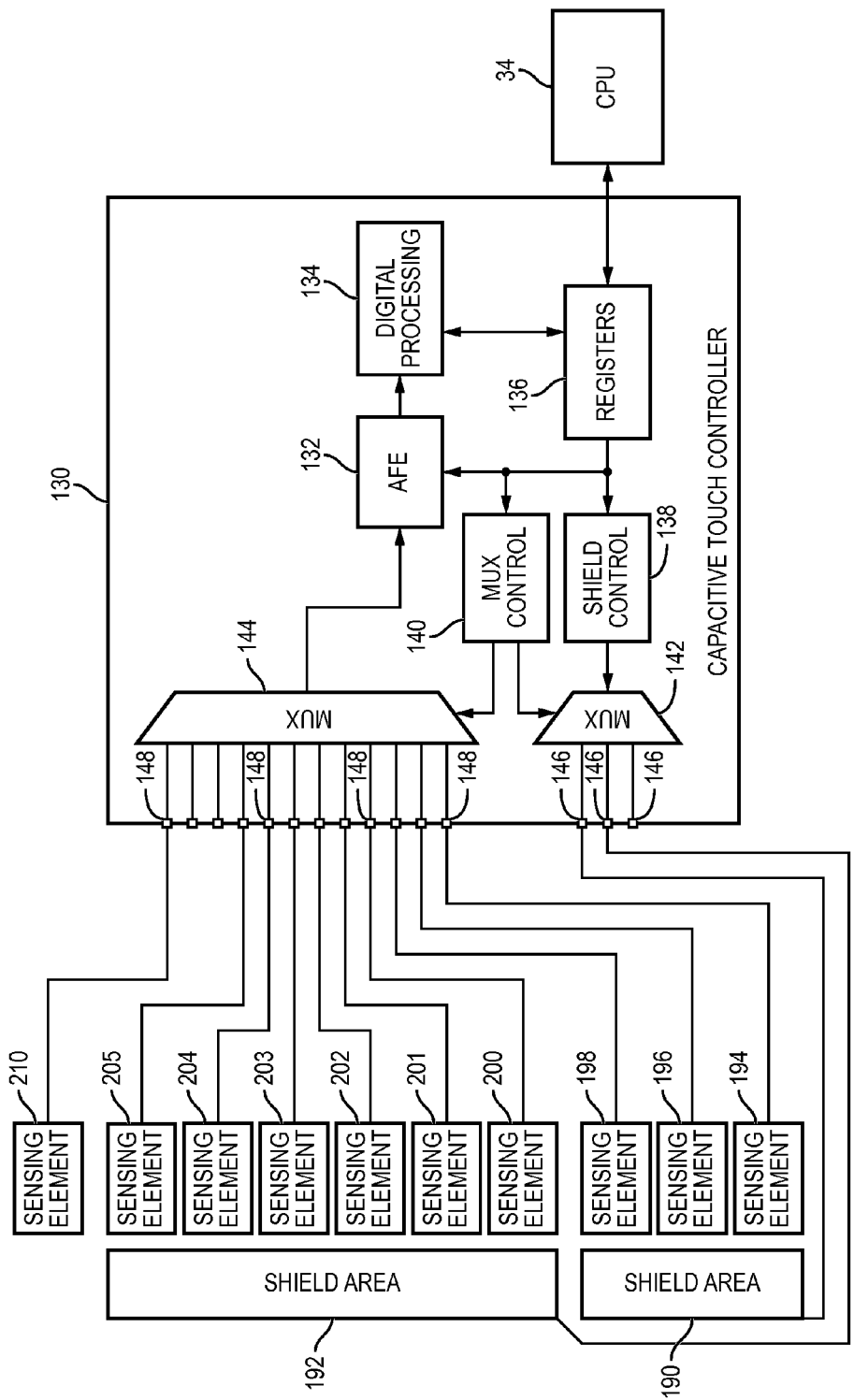

As configured in FIG. 5a, twelve sensing elements and three shielding areas are connected to capacitive touch controller 130. FIG. 5b illustrates another configuration of capacitive touch controller 130 which does not utilize each sensing terminal 148 and shield terminal 146, and includes a sensing element with no associated shielding area. CPU 34 has configured capacitive touch controller 130 to use three sensing terminals 148 with a first shield terminal 146, six sensing terminals 148 are used with a second shield terminal 146, and one sensing terminal 148 is not associated with any shield terminal 146. Two sensing terminals 148 are not used, and one shield terminal 146 is not used.

Sensing elements 194-198 are used for buttons 14 of mobile device 10, and share shielding area 190. When proximity of user 30 is detected by one of sensing elements 194-198, CPU 34 is notified so that the operating system can handle the button press. Sensing elements 200-205 are distributed under touchscreen 12 to add high accuracy z-axis detection to the touchscreen. CPU 34 reads a capacitance value for sensing elements 200-205 to determine a distance of a finger or other body part of user 30 from touchscreen 12. Sensing elements 200-205 share shielding area 192. Sensing element 210 is used for proximity sensor 11. A shielding area is not used with sensing element 210 because proximity or absence of proximity is needed by CPU 34, and a high accuracy z-axis distance is not needed. In other embodiments, sensing terminals 148 are grouped to shield terminals 146 in any number and for any reason that proximity or distance detection of an object is desired. In some embodiments, more or less than twelve sensing terminals and more or less than three shield terminals are provided.

In using sensing elements 200-205 to detect the z-axis distance of user 30 from touchscreen 12, CPU 34 desires real-time feedback so that the user does not detect any lag between motion of a finger and a reaction displayed on the touchscreen. Sensing elements 200-205 are configured to be measured by capacitive touch controller 130 as quickly as possible. Capacitive touch controller 130 measures the self-capacitance of sensing element 200 and stores a $C_{USER}$ value in registers 136, then immediately measures the self-capacitance of sensing element 201, followed by sensing elements 202-205. Once the self-capacitance of each sensing element 200-205 has been measured, capacitive touch controller 130 returns to measure the self-capacitance of sensing element 200 again without waiting for any time to go by, unless sensing elements 194-198 or 210 are scheduled to be measured. Shielding area 192 remains coupled to shield control 138 by MUX 142 during measurement of sensing elements 200-205.

Sensing element 210 does not require as high of frequency proximity detection as sensing elements 200-205. CPU 34 configures capacitive touch controller 130 to measure sensing element 210 once after every five times sensing elements 200-205 are measured. MUX control 140 includes a counter, which is incremented each time the MUX control completes measuring the self-capacitance of all sensing elements 200-205. When the counter reaches five, MUX control 140 controls MUX 144 to couple sensing element 210 to AFE 132 and controls MUX 142 so that no shielding area is coupled to shield control 138. The $C_{USER}$ of sensing element 210 is stored in the corresponding register in registers 136, and the counter in MUX control 140 is reset. Capacitive touch controller 130 returns to rapidly measuring the self-capacitance of sensing elements 200-205 after measuring sensing element 210.

Sensing elements 194-198 also require a lower frequency of detection than sensing elements 200-205. CPU 34 sets a configuration register in registers 136 which instructs capacitive touch controller 130 to measure the self-capacitance of sensing elements 194-198 one time every quarter of a second. MUX control 140 includes a timer which is configured to time out after one quarter of a second. When the timer times out, MUX control 140 controls MUX 142 to couple shielding area 190 to shield control 138. MUX 144 is controlled by MUX control 140 to couple sensing elements 194-198 to AFE 132 one at a time for measurement. A $C_{USER}$ value for each sensing element 194-198 is stored in corresponding registers in registers 136. CPU 34 will also be interrupted when proximity is detected if capacitive touch controller 130 is configured to do so. In some embodiments, capacitive touch controller 130 is configured to measure the self-capacitance of individual sensing elements with any set frequency or period length. The frequency of measurements is changed dynamically as more or less frequent measurements are desired. In other embodiments, CPU 34 sets a specific pattern for the measurement of sensing elements, or otherwise configures capacitive touch controller 130 to measure self-capacitance in any desired order.

Customizing the groupings of sensing elements used with individual shielding areas provides flexibility in the timing and other constraints used with the different groupings. Performance can be optimized for different groupings of sensing elements, and different tradeoffs can be made by a manufacturer, e.g., between performance, accuracy, and power consumption, for each grouping. A manufacturer optimally configures one grouping of sensing elements for one use without effecting or preventing other configurations for another grouping of sensing elements. A single chip implementation reduces used area and cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a proximity sensor, comprising:
   providing a capacitive touch controller;
   coupling a first shielding area to a first shield terminal of the capacitive touch controller;
   coupling a second shielding area to a second shield terminal of the capacitive touch controller;
   disposing a first sensing element directly over the first shielding area and outside a footprint of the second shielding area;
   disposing a second sensing element directly over the second shielding area and outside a footprint of the first shielding area;
   configuring the capacitive touch controller to associate the first shielding area with the first sensing element; and
   configuring the capacitive touch controller to associate the second shielding area with the second sensing element.

2. The method of claim 1, further including disposing a plurality of first sensing elements directly over the first shielding area and outside a footprint of the second shielding area.

3. The method of claim 1, further including:
   coupling the first sensing element to a first sensing terminal of the capacitive touch controller; and
   coupling the second sensing element to a second sensing terminal of the capacitive touch controller.

4. The method of claim 1, further including measuring a self-capacitance of the first sensing element with the capacitive touch controller while the second shielding area is inactive.

5. The method of claim 1, further including configuring the capacitive touch controller to measure a self-capacitance of the first sensing element at a first frequency.

6. A method of making a proximity sensor, comprising:
providing a capacitive touch controller;
coupling a first shielding area to a first terminal of the capacitive touch controller;
coupling a second shielding area to a second terminal of the capacitive touch controller;
disposing a sensing element over the first shielding area; and
measuring a self-capacitance of the sensing element with the capacitive touch controller while the second shielding area is inactive.

7. The method of claim 6, wherein providing the capacitive touch controller includes providing a shield control module coupled to the first shielding area or second shielding area.

8. The method of claim 7, wherein providing the capacitive touch controller includes providing a multiplexer (MUX) coupled to the shield control module and configured to modify the coupling between the first shielding area and the shield control module.

9. The method of claim 6, further including configuring the capacitive touch controller to associate the sensing element with the first shielding area.

10. The method of claim 6, further including coupling the sensing element to a third terminal of the capacitive touch controller.

11. The method of claim 6, further including:
disposing the first shielding area on a first surface or layer of a printed circuit board (PCB); and
disposing the sensing element on a second surface or layer of the PCB.

12. A proximity sensing circuit, comprising:
a capacitive touch controller;
a first shielding area coupled to a first shield terminal of the capacitive touch controller;
a second shielding area coupled to a second shield terminal of the capacitive touch controller; and
a first sensing element disposed over the first shielding area and outside a footprint of the second shielding area.

13. The proximity sensing circuit of claim 12, wherein the first sensing element is coupled to a first sensing terminal of the capacitive touch controller.

14. The proximity sensing circuit of claim 13, further including a second sensing element disposed adjacent to the second shielding area and coupled to a second sensing terminal of the capacitive touch controller.

15. The proximity sensing circuit of claim 13, wherein the capacitive touch controller includes a configuration register to associate the first sensing element and first shielding area.

16. The proximity sensing circuit of claim 12, wherein the capacitive touch controller includes a shield control module coupled to the first shielding area or second shielding area.

17. The proximity sensing circuit of claim 16, wherein the capacitive touch controller includes a multiplexer (MUX) coupled to the shield control module and configured to modify the coupling between the first shielding area and the shield control module.

18. The proximity sensing circuit of claim 12, further including a plurality of sensing elements disposed adjacent to the first shielding area.

19. The proximity sensing circuit of claim 12, wherein the first sensing element is disposed on a printed circuit board opposite the first shielding area.

20. A capacitive touch controller, comprising:
a first shield terminal;
a second shield terminal;
a shield control module;
a first multiplexer (MUX) for selectively coupling the first shield terminal or second shield terminal to the shield control module;
a first sensing terminal;
a second sensing terminal;
an analog front-end; and
a second MUX for selectively coupling the first sensing terminal or second sensing terminal to the analog front-end.

21. The capacitive touch controller of claim 20, wherein the first sensing terminal is configured to be associated with the first shield terminal and the second sensing terminal is configured to be associated with the second shield terminal.

22. The capacitive touch controller of claim 20, further including:
a configuration register; and
a MUX controller for controlling the first MUX and second MUX based on the configuration register.

23. The capacitive touch controller of claim 20, wherein the first MUX is capable of isolating the first shield terminal from the second shield terminal.

* * * * *